US012795868B2

(12) United States Patent
Chehade et al.

(10) Patent No.: US 12,795,868 B2

(45) Date of Patent: Nov. 10, 2026

(54) DATACENTER LIQUID COOLING ARRANGEMENT FOR REDUCING ICING RISKS OF DRY COOLERS

(71) Applicant: OVH, Roubaix (FR)

(72) Inventors: Ali Chehade, Moncheaux (FR); Charbel Masri, Lille (FR); Mohamad Hnayno, Roubaix (FR)

(73) Assignee: OVH, Roubaix (FR)

( * ) Notice: Subject to any disclaimer, the term of this patent is extended or adjusted under 35 U.S.C. 154(b) by 272 days.

(21) Appl. No.: 18/793,515

(22) Filed: Aug. 2, 2024

(65) Prior Publication Data

US 2025/0071953 A1 Feb. 27, 2025

(30) Foreign Application Priority Data

Aug. 24, 2023 (EP) .................................... 23306415

(51) Int. Cl.
*H05K 7/20* (2006.01)
*F28C 1/14* (2006.01)

(52) U.S. Cl.
CPC ..... *H05K 7/20836* (2013.01); *H05K 7/20272* (2013.01); *H05K 7/20781* (2013.01); *F28C 1/14* (2013.01); *H05K 7/20709* (2013.01)

(58) Field of Classification Search
CPC ........... H05K 7/20272; H05K 7/20836; H05K 7/20781; H05K 7/20709; F28C 1/14
See application file for complete search history.

(56) References Cited

U.S. PATENT DOCUMENTS 11,359,847 B2 6/2022 Kopko et al.
2009/0201645 A1* 8/2009 Kashirajima ...... H05K 7/20827 165/104.33

(Continued)

FOREIGN PATENT DOCUMENTS

CN 101563574 B * 7/2011 ......... H05K 7/20836
CN 107182190 A * 9/2017 ......... H05K 7/20827

(Continued)

OTHER PUBLICATIONS

Translation of CN107182190A named Translation—CN107182190A (Year: 2017).*

(Continued)

*Primary Examiner* — Paul Alvare
(74) *Attorney, Agent, or Firm* — BCF LLP

(57) ABSTRACT

A liquid cooling system and method for preventing icing of a dry cooler components is presented that includes a first liquid distribution circuit to convey cooling liquid from the dry cooler, second liquid distribution circuit to convey heated liquid to the dry cooler, an auxiliary liquid feed circuit for supplementing the liquid flow back to the dry cooler, a first temperature sensor to measure the cooling liquid temperature, a volume sensor to measure the cooling liquid flow rate, and a smart bypass control valve fluidly-coupled to the auxiliary feed circuit and the second liquid distribution circuit. Upon determining that the cooling liquid flow rate is less than a minimum volume, opening the bypass control valve to allow the auxiliary feed circuit to increase liquid flow back to the dry cooler and upon determining that the cooling liquid temperature is less than a minimum temperature, issuing an alert message.

15 Claims, 4 Drawing Sheets

100

(56) References Cited

U.S. PATENT DOCUMENTS

| | | | | |
|---|---|---|---|---|
| 2010/0139294 | A1* | 6/2010 | Lowe | F25D 17/02<br>62/157 |
| 2019/0186801 | A1* | 6/2019 | Kopko | F25B 23/006 |

FOREIGN PATENT DOCUMENTS

| | | | | | |
|---|---|---|---|---|---|
| CN | 107182191 | A | * | 9/2017 | H05K 7/208 |
| CN | 108375132 | A | * | 8/2018 | F24F 11/63 |
| CN | 112654218 | A | * | 4/2021 | H05K 7/20836 |
| CN | 216647643 | U | * | 5/2022 | |
| CN | 115900023 | A | * | 4/2023 | |
| CN | 219437437 | U | * | 7/2023 | |
| JP | 2009193246 | A | * | 8/2009 | |

OTHER PUBLICATIONS

Translation of CN219437437U named Translation—CN219437437U (Year: 2023).*

European Search Report to the counterpart EP Patent Application No. 23306415.3 completed on Feb. 2, 2024.

* cited by examiner

200

300

DATACENTER LIQUID COOLING ARRANGEMENT FOR REDUCING ICING RISKS OF DRY COOLERS

CROSS REFERENCE

The present application claims priority to EP Application No 23306415.3 filed Aug. 24, 2023, entitled "DATACENTER LIQUID COOLING ARRANGEMENT FOR REDUCING ICING RISKS OF DRY COOLERS", the entirety of which is incorporated herein by reference.

FIELD

The present technology generally relates to the field of datacenter cooling arrangements and, in particular, to the control of minimizing icing risks of datacenter dry cooling units servicing the liquid cooling needs of rack-mounted processing assemblies.

BACKGROUND

Datacenters as well as many computer processing facilities house multitudes rack-mounted electronic processing equipment. In operation, such electronic processing equipment generates a substantial amount of heat that must be dissipated in order avoid electronic component failures and ensure continued efficient processing operations.

To this end, various liquid cooling measures have been implemented to facilitate the dissipation of heat generated by the electronic processing equipment. One such measure employs liquid block cooling techniques for directly cooling one or more heat-generating processing components. This technique utilizes liquid cooling blocks having internal channels that receive cooling liquid from a cooling liquid source that are in thermal contact with the heat-generating processing components.

Depending on the access to water resources, in many cases, the preferred cooling liquid source comprises a dry cooling unit. Dry cooling units supply cooling liquid to rack-mounted electronic processing equipment as well as receive heated liquid from the electronic processing equipment and are configured to re-cool the received heated liquid for circulation back to the electronic processing equipment. However, given the multitudes rack-mounted electronic processing equipment that require liquid cooling measures, dry cooling units occupy large spaces and are typically installed outside of the datacenters/computer processing facilities. In so doing, dry cooling units are typically exposed to external environmental factors, including freezing weather and icing conditions.

As such, there remains an interest in reducing the risk of liquid supplied by and flowing through the dry cooling unit from icing due to freezing conditions.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on certain drawbacks associated with conventional dry cooling techniques and implementations.

In one aspect of the inventive concepts, the present technology provides a freeze prevention liquid cooling arrangement for datacenter rack-mounted processing assemblies, comprising a dry cooling unit configured to supply a cooling liquid to the rack-mounted processing assemblies and receive a heated liquid from the rack-mounted processing assemblies; a first liquid distribution circuit to convey the cooling liquid from the dry cooling unit to the rack-mounted processing assemblies; a second liquid distribution circuit to convey the heated liquid from the rack-mounted processing assemblies to the dry cooling unit; an auxiliary liquid feed circuit for supplementing the liquid flow back to the dry cooling unit; each of the rack-mounted data processing assemblies comprising at least one heat-generating electronic processing element and at least one liquid cooling block arranged to be in respective thermal contact with the at least one heat-generating electronic processing element and fluidly-coupled to the first liquid distribution circuit and a smart control valve respectively arranged to be fluidly-coupled to the at least one liquid cooling block of the corresponding rack-mounted data processing assembly.

The freeze prevention liquid cooling arrangement further incorporates a first temperature sensor to measure a temperature of the supplied cooling liquid $T_C$, a second temperature sensor to measure a temperature of the heated liquid $T_{PA}$ from the data processing assemblies, a pressure sensor to measure a pressure $P_W$ within a water storage tank, and a volume sensor to measure a flow rate of the supplied cooling liquid $V_C$; a smart bypass control valve fluidly-coupled to the auxiliary liquid feed circuit and the return liquid distribution circuit; and a freeze prevention module configured to: determine whether the measured flow rate of the supplied cooling liquid $V_C$ is less than a prescribed threshold minimum volume $V_{min}$, control the smart bypass control valve based on whether the $V_C$ is less than $V_{min}$, determine, whether the measured temperature of the supplied cooling liquid $T_C$ is less than a prescribed threshold minimum temperature $T_{min}$, and control the smart bypass control valve based on whether the $V_C$ is less than $V_{min}$.

An additional feature of the freeze prevention liquid cooling arrangement is that the freeze prevention module is further configured to: determine whether the measured pressure within the water storage tank $P_W$ is less than a prescribed threshold minimum pressure $P_{min}$ and control the smart bypass control valve based on whether the $P_W$ is less than $P_{min}$.

Another feature of the freeze prevention liquid cooling arrangement is that the smart bypass control valve is configured to receive and respond to control instructions from the freeze prevention module to open or close a flow of liquid therethrough.

And, another feature of the freeze prevention liquid cooling arrangement is that, in response to determining that the measured pressure within the water storage tank $P_W$ is not less than the prescribed threshold minimum pressure $P_{min}$ and that the measured flow rate of the supplied cooling liquid $V_C$ is less than the threshold minimum volume $V_{min}$, controlling the smart bypass control valve to open and allow the auxiliary liquid feed circuit to increase the liquid flow back to the dry cooling unit.

An additional feature of the freeze prevention liquid cooling arrangement is that, upon controlling the smart bypass control valve to open, the freeze prevention module continues to check whether the measured flow rate of the supplied cooling liquid $V_C$ is still less than the threshold minimum volume $V_{min}$.

In yet another feature of the freeze prevention liquid cooling arrangement is that, upon determining that the measured temperature of the supplied cooling liquid $T_C$ is less than the prescribed threshold minimum temperature $T_{min}$ or that the measured pressure within the water storage tank $P_W$ is less than the prescribed threshold minimum pressure $P_{min}$, issuing an alert message indicating that operator intervention/control is required.

In a related aspect of the inventive concepts, the present technology provides a freeze prevention process for a liquid cooling system for rack-mounted processing assemblies, comprising providing a dry cooling unit to supply a cooling liquid to the rack-mounted processing assemblies and receive a heated liquid from the rack-mounted processing assemblies; providing a first liquid distribution circuit to convey the cooling liquid from the dry cooling unit to the rack-mounted processing assemblies, a second liquid distribution circuit to convey the heated liquid from the rack-mounted processing assemblies to the dry cooling unit, and an auxiliary liquid feed circuit for supplementing the liquid flow back to the dry cooling unit; each of the rack-mounted data processing assemblies comprising at least one heat-generating electronic processing element and at least one liquid cooling block arranged to be in respective thermal contact with the at least one heat-generating electronic processing element and fluidly-coupled to the first liquid distribution circuit and a smart control valve respectively arranged to be fluidly-coupled to the at least one liquid cooling block of the corresponding rack-mounted data processing assembly; and providing, along the first liquid distribution circuit, a first temperature sensor to measure a temperature of the supplied cooling liquid $T_C$, a second temperature sensor to measure a temperature of the heated liquid $T_{PA}$ from the data processing assemblies, a pressure sensor to measure a pressure $P_W$ within a water storage tank, and a volume sensor to measure a flow rate of the supplied cooling liquid $V_C$.

The freeze prevention process further includes providing a smart bypass control valve fluidly-coupled to the auxiliary liquid feed circuit and the return liquid distribution circuit; determining whether the measured flow rate of the supplied cooling liquid $V_C$ is less than a prescribed threshold minimum volume $V_{min}$; controlling the smart bypass control valve based on whether the $V_C$ is less than $V_{min}$; determining, whether the measured temperature of the supplied cooling liquid $T_C$ is less than a prescribed threshold minimum temperature $T_{min}$; and controlling the smart bypass control valve based on whether the $V_C$ is less than $V_{min}$.

An additional feature of the freeze prevention process is determining whether the measured pressure within the water storage tank $P_W$ is less than a prescribed threshold minimum pressure $P_{min}$ and controlling the smart bypass control valve based on whether the $P_W$ is less than $P_{min}$.

Another feature of the freeze prevention process is that, in response to determining that the measured flow rate of the supplied cooling liquid $V_C$ is less than the threshold minimum volume $V_{min}$, controlling the smart bypass control valve to open and allow the auxiliary liquid feed circuit to increase the liquid flow back to the dry cooling unit.

And another feature of the freeze prevention process is that, in response to determining that the measured pressure within the water storage tank $P_W$ is less than the prescribed threshold minimum pressure $P_{min}$, issuing an alert message indicating that operator intervention/control is required.

In yet another feature of the freeze prevention process is that, upon determining that the measured flow rate of the supplied cooling liquid $V_C$ is not less than the threshold minimum volume $V_{min}$, determining whether the measured temperature of the supplied cooling liquid $T_C$ is less than the prescribed threshold minimum temperature $T_{min}$ and if $T_C$ is less than $T_{min}$, issuing an alert message indicating that operator intervention/control is required.

In an additional feature of the freeze prevention process is that, in response to determining that the measured pressure within the water storage tank $P_W$ is not less than the prescribed threshold minimum pressure $P_{min}$ while the measured flow rate of the supplied cooling liquid $V_C$ is less than the threshold minimum volume $V_{min}$, controlling the smart bypass control valve to open and allow the auxiliary liquid feed circuit to increase the liquid flow back to the dry cooling unit.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
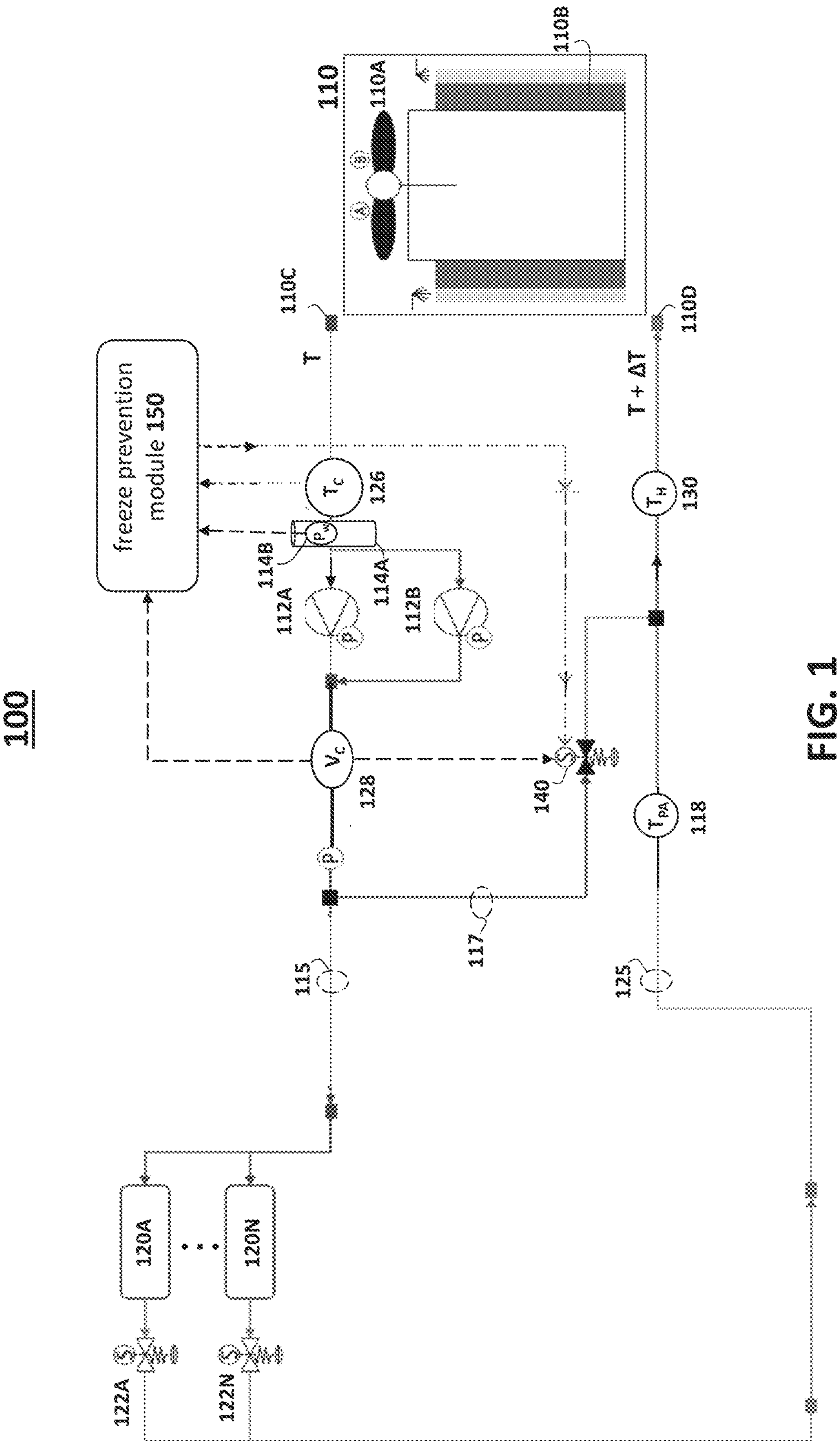
FIG. 1 illustrates a high-level functional block diagram of a freeze prevention liquid cooling arrangement for datacenter rack-mounted processing assemblies, in accordance with the nonlimiting embodiments of the present technology.

It should be appreciated that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in non-transitory computer-readable media and so executed by a computer or processor, whether or not such computer or processor is explicitly shown.

The functions of the various elements shown in the FIGs. including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

Given this fundamental understanding, the disclosed embodiments are directed to a freeze prevention liquid cooling arrangement that services rack-mounted processing assemblies and a related freeze prevention process that are both configured to prevent the icing of a dry cooling unit and/or corresponding fluidly-coupled liquid distribution circuits during freezing environmental conditions.

FIG. 1 illustrates a high-level functional block diagram of a freeze prevention liquid cooling arrangement 100 for datacenter rack-mounted processing assemblies, in accordance with the nonlimiting embodiments of the present technology. As shown, the arrangement 100 includes a dry cooling unit 110, a plurality of rack-mounted processing assemblies 120A-120N, a plurality of "smart" valves 122A-122N in which each smart valve is fluidly-coupled to a respective processing assembly, a forward liquid distribution circuit 115 incorporating at least one pump 112A, 112B for supplying cooling liquid from the dry cooling unit 110, a return liquid distribution circuit 125 for returning heated liquid back to the dry cooling unit 110, and an auxiliary liquid feed circuit 117 for supplementing the cooling liquid flow back to the dry cooling unit 110.

The dry cooling unit 110 may be located on any suitable stable support surface, such as, for example, the roof of a datacenter/computer processing facility building. The dry cooling unit 110 incorporates an outlet 110C configured to supply cooling liquid and an inlet 110D configured receive heated liquid. The dry cooling unit 110 serves to dissipate thermal energy from a heated liquid circulating therethrough to the ambient environment. For example, in a datacenter or similar facility, the dry cooling unit 110 operates to receive heated liquid from the rack-mounted processing assemblies 120A-120N (e.g., water circulated through water blocks in contact with heat-generating components) and extracts the thermal energy from the heated liquid by dissipating the energy into the ambient environment via the at least one fan assembly 110A, thereby re-cooling the heated liquid. The dry cooling unit 110 then operates to supply the re-cooled liquid back to the rack-mounted processing assemblies 120A-120N.

With respect to the cooling/re-cooled liquid, in some embodiments the cooling/re-cooled liquid comprises water. In other embodiments, the cooling/re-cooled liquid may comprise water containing additives, such as, for example, anti-corrosion inhibitors. While these cooling/re-cooled liquid embodiments may manifest different temperature-related performance properties, it will be appreciated that the exact composition of the cooling/re-cooled liquid does not affect the overall inventive concepts presented by the instant disclosure.

As shown, the dry cooling unit 110 includes at least one heat exchanger 110B and at least one fan assembly 110A. The heat exchanger 110 may manifest a variety of configurations, such as, air-to-liquid heat exchanger etc., and may further include evaporating or cooling pads. For purposes of the instant disclosure, the exact configuration of the dry cooling unit 110 and heat exchanger 110 is not limiting, as various configurations could be employed without departing from the concepts of the instant disclosure.

The cooling/re-cooled liquid is supplied by the dry cooling unit 110 to the rack-mounted processing assemblies 120A-120N via the outlet 110C and forward liquid distribution circuit 115. The forward liquid distribution circuit 115 incorporates at least one pump 112A as well as a water storage tank 114A fluidly coupled to the input side of the at least one pump 112A. The water storage tank 114A also includes a pressure sensor 114B configured to measure the pressure $P_w$ within the water storage tank 114A. In the depicted embodiment, forward liquid distribution circuit 115 incorporates two pumps 112A, 112B arranged in a parallel configuration to maintain the flow rate of the cooling/re-cooled liquid supplied to the processing assemblies 120A-120N at an adequate level.

The heated liquid from the rack-mounted processing assemblies 120A-120N is returned back to the dry cooling unit 110 for re-cooling via the return liquid distribution circuit 125 and inlet 110D. As shown, the dry cooling unit 110 supplies the cooling/re-cooled liquid to the rack-mounted processing assemblies 120A-120N at a nominal temperature T and the heated liquid returned to the dry cooling unit 110 is at a nominal temperature T+ΔT, where ΔT represents the temperature differential between the cooling/re-cooled liquid and the heated liquid.

Returning to FIG. 1, the liquid cooling arrangement 100 includes a plurality of rack-mounted processing assemblies 120A-120N which receive the supplied cooling/re-cooled liquid via the forward liquid distribution circuit 115, internally channel the liquid to the heat-generating processing components (e.g., water circulated through water blocks), and convey the heated liquid from the heat-generating processing components to the return liquid distribution circuit 125.

The rack-mounted processing assemblies 120A-120N may or may not be configured with similar heat-generating processing components. As such, each of the rack-mounted processing assemblies 120A-120N may have different temperature and flow rate requirements for proper operations.

It will be appreciated that, while the rack-mounted processing assemblies 120A-120N are shown to be arranged in a parallel configuration, it is not meant to be limiting, as the processing assemblies 120A-120N may also be arranged in a serial or combined parallel and serial configuration without departing from the concepts of the instant disclosure.

As shown, each of the rack-mounted processing assemblies 120A-120N is fluidly-coupled to a "smart" valve 122A-122N that dynamically controls the flow rate of the corresponding processing assembly 120A-120N based on detected liquid temperatures. For purposes of the instant disclosure, the term "smart" valve refers to a valve that is pressure-independent, temperature-responsive, and incorporates a differential pressure regulator to automatically adjust to system pressure changes. Such smart valves may comprise PICVs, ABQMs, or other functionally similar valves.

As noted above, the liquid cooling arrangement 100 incorporates a pressure sensor 114B configured to measure the pressure $P_w$ within the water storage tank 114A. The liquid cooling arrangement 100 also incorporates a temperature sensor 126 for measuring the temperature of the supplied cooling liquid $T_C$ along the forward liquid distribution circuit 115, a volume sensor 128 for measuring the flow rate of the supplied cooling liquid $V_C$ along the forward liquid distribution circuit 115, a temperature sensor 118 for measuring the temperature of the liquid $T_{PA}$ directly discharged by the processing assemblies 120A-120N, and a temperature sensor 130 for measuring the temperature of the returned heated liquid $T_H$ at the end of the return liquid distribution circuit 125.

The liquid cooling arrangement 100 additionally incorporates a smart bypass control valve 140 that is fluidly-coupled to the auxiliary liquid feed circuit 117 and the return liquid distribution circuit 125 as well as being communicatively coupled to the volume sensor 128 that measures the cooling liquid flow rate $V_C$.

The liquid cooling arrangement 100 further incorporates a freeze prevention module 150 that is communicatively coupled to the temperature sensor 126 for receiving the measured temperature of cooling liquid $T_C$, volume sensor 128 that measures the cooling liquid flow rate $V_C$, the pressure sensor 114B configured to measure the water storage tank pressure $P_w$, and the bypass control valve 140. As will be described in greater detail below, module 150 operates to receive the measured $T_C$, $V_C$, and $P_W$ values and determines whether these values indicate the need for increased liquid flow due to prevailing environmental conditions. And if so, module 150 operates to open up the smart bypass control valve 140 to allow additional liquid flow, via the auxiliary liquid feed circuit 117, onto the return liquid distribution circuit 125 to supply the dry cooling unit 110 with an increased flow rate to prevent or minimize icing occurrences therein and throughout the corresponding fluidly-coupled liquid distribution circuits.

Figure 2:
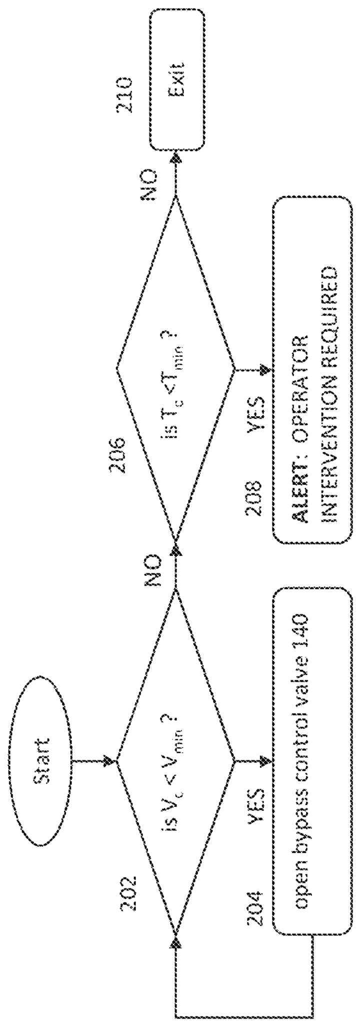
FIG. 2 illustrates a flow diagram of a freeze prevention process for a liquid cooling system for rack-mounted processing assemblies, in accordance with the nonlimiting embodiments of the present technology.

With this said, FIG. 2 illustrates a flow diagram of a freeze prevention process 200 for a liquid cooling system containing rack-mounted processing assemblies, in accordance with the nonlimiting embodiments of the present technology. In the depicted embodiment, process 200 or portions thereof are shown to be executed by the freeze prevention module 150. The execution of freeze prevention module 150 may be performed by a controller 400.

Figure 4:
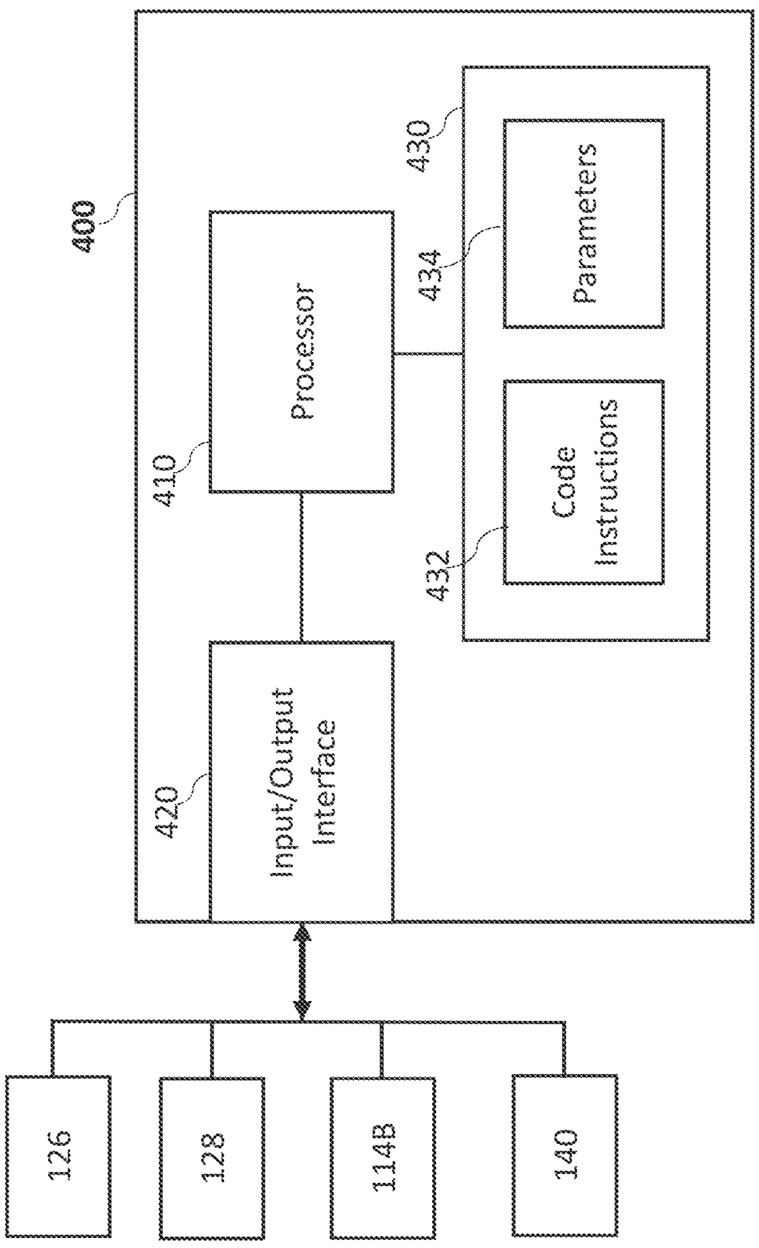
FIG. 4 illustrates a high-level functional block diagram of a controller of the freeze prevention liquid cooling arrangement.

For example, such a controller 400 is depicted by the high-level functional block diagram of FIG. 4. As shown, the controller 400 comprises a processor or a plurality of cooperating processors (represented as a processor 410 for simplicity), a memory device or a plurality of memory devices (represented as a memory device 430 for simplicity), and an input/output interface 420 (or separate input and output interfaces) allowing the controller 400 to communicate with certain components of the liquid cooling arrangement 100. The processor 410 is operatively connected to the memory device 430 and to the input/output interface 420. The memory device 430 includes a storage for storing parameters 434, including for example and without limitation the above-mentioned pre-determined conductivity thresholds. The memory device 430 may comprise a non-transitory computer-readable medium for storing code instructions 432 that are executable by the processor 410 to allow the controller 400 to perform the various tasks allocated to the controller 400.

The controller 400 is operatively connected, via the input/output interface 420, to the components of liquid cooling arrangement 100, such as, the temperature sensor 126 that measures the temperature of cooling liquid $T_C$, the volume sensor 128 that measures the cooling liquid flow rate $V_C$, the pressure sensor 114B that measures the water storage tank pressure $P_w$, and the bypass control valve 140. The controller 400 executes the code instructions 432 stored in the memory device 430 to implement the various above-described functions of the freeze prevention module 150.

However, it will be appreciated that in other embodiments, freeze prevention process 200 or portions thereof may be executed by relevant components, such as, for example, temperature sensors, volume sensors, and smart bypass control valves. For purposes of the instant disclosure, the exact entity or entities executing process 200 is not limiting with regard to the presented inventive concepts.

Returning back to FIG. 2, freeze prevention process 200 commences at decision block 202 to determine whether the measured flow rate of the supplied cooling liquid $V_C$ is less than a prescribed threshold minimum $V_{min}$. The prescribed threshold minimum $V_{min}$ is calculated to take into account component performance characteristics relative to prevailing temperature conditions. So, if the measured supplied cooling liquid flow rate $V_C$ is less than the threshold minimum $V_{min}$, then at task block 204, process 200 directs smart bypass control valve 140 to open up and allow auxiliary liquid feed circuit 117 to redirect a portion of the cooling liquid flow back to the dry cooling unit 110 to supplement the flow rate. Process 200 then reverts back to decision block 202 until the measured supplied cooling liquid flow rate $V_C$ is no longer less than the threshold minimum $V_{min}$.

Process 200 then moves to decision block 206 to determine whether the measured temperature of the supplied cooling liquid $T_C$ is less than a prescribed threshold minimum $T_{min}$. The prescribed threshold minimum $T_{min}$ is calculated to take into account component performance characteristics relative to the cooling liquid composition (e.g., water or water plus additives) along with the prevailing temperature conditions. In some nonlimiting embodiments, $T_{min}$ may be set between approximately 5° C. to approximately 10° C. If $T_C$ is not less than $T_{min}$, process 200 exits at task block 210, thereby indicating that the supplemented flow rate has increased the temperature of the liquid flowing through the dry cooling unit 110 to prevent any icing issues.

However, if at decision block 206 it is determined that the measured temperature of the supplied cooling liquid $T_C$ is less than a prescribed threshold minimum $T_{min}$, process 200 advances to task block 208 to issue an alert message to operator indicating that the increased flow rate is insufficient to prevent icing given the prevailing temperature conditions and that operator intervention/control is required.

In this manner, freeze prevention process 200 functions to control and adjust the liquid flow rate supplied to the dry cooling unit to prevent the icing of the dry cooling unit and/or corresponding fluidly-coupled liquid distribution circuits in the event of freezing environmental conditions.

Figure 3:
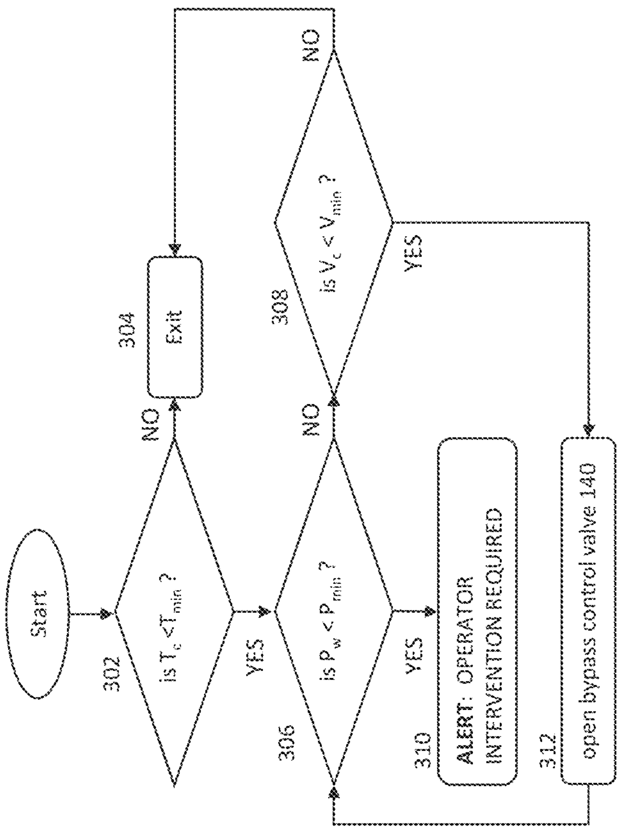
FIG. 3 illustrates a flow diagram of an additional freeze prevention process for a liquid cooling system containing rack-mounted processing assemblies, in accordance with the nonlimiting embodiments of the present technology.

FIG. 3 illustrates a flow diagram of another freeze prevention process 300 for a liquid cooling system containing rack-mounted processing assemblies, in accordance with additional nonlimiting embodiments of the present technology.

As shown, freeze prevention process 300 commences at decision block 302 to determine whether the measured temperature of the supplied cooling liquid $T_C$ is less than a prescribed threshold minimum $T_{min}$. As previously noted, the prescribed threshold minimum $T_{min}$ is calculated to take into account component performance characteristics relative to the cooling liquid composition (e.g., water or water plus additives) along with the prevailing temperature conditions. If $T_C$ is not less than $T_{min}$, process 300 exits at task block

304, thereby indicating that the temperature of the liquid flowing through the dry cooling unit 110 is sufficient to prevent any icing issues.

However, if it is determined that the measured temperature of the supplied cooling liquid $T_C$ is less than a prescribed threshold minimum $T_{min}$, process 300 advances to decision block 306 to determine whether the measured pressure $P_W$ of the water storage tank 114A is less than a prescribed minimum threshold $P_{min}$. If so, process 300 proceeds to task block 310 to issue an alert message to an operator indicating that either the temperature $T_c$ and/or water pressure $P_w$ are insufficient to prevent icing given the prevailing temperature conditions and that operator intervention/control is required.

However, if it is determined that the measured pressure $P_w$ of the water storage tank 114A is not less than a prescribed minimum threshold $P_{min}$, then process 300 moves to decision block 308 to determine whether the measured flow rate of the supplied cooling liquid $V_C$ is less than a prescribed threshold minimum $V_{min}$. If not, process 300 reverts back to task block 304 for exiting, thereby indicating that the temperature of the liquid and the volume flowing through the dry cooling unit 110 is sufficient to prevent any icing issues.

If it is determined that the measured flow rate of the supplied cooling liquid $V_C$ is less than a prescribed threshold minimum $V_{min}$, process 300 proceeds to task block 312 to direct smart bypass control valve 140 to open up and allow auxiliary liquid feed circuit 117 to redirect a portion of the cooling liquid flow back to the dry cooling unit 110 to supplement the flow rate.

Process 300 then return to decision block 306 to cycle back through the determination of whether the measured pressure $P_w$ of the water storage tank 114A is less than a prescribed minimum threshold $P_{min}$, given the opening of the smart bypass control valve 140.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A liquid cooling method for rack-mounted processing assemblies, comprising:

providing a dry cooling unit to supply a cooling liquid to the rack-mounted processing assemblies and receive a heated liquid from the rack-mounted processing assemblies;

providing a first liquid distribution circuit to convey the cooling liquid from the dry cooling unit to the rack-mounted processing assemblies, a second liquid distribution circuit to convey the heated liquid from the rack-mounted processing assemblies to the dry cooling unit, and an auxiliary liquid feed circuit for supplementing the liquid flow back to the dry cooling unit;

each of the rack-mounted processing assemblies comprising at least one heat-generating electronic processing element and at least one liquid cooling block arranged to be in respective thermal contact with the at least one heat-generating electronic processing element and fluidly-coupled to the first liquid distribution circuit and a smart control valve respectively arranged to be fluidly-coupled to the at least one liquid cooling block of the corresponding rack-mounted processing assembly;

providing, along the first liquid distribution circuit, a first temperature sensor to measure a temperature of the supplied cooling liquid, a second temperature sensor to measure a temperature of the heated liquid from the processing assemblies, a pressure sensor to measure a pressure within a water storage tank, and a volume sensor to measure a flow rate of the supplied cooling liquid;

providing a smart bypass control valve fluidly-coupled to the auxiliary liquid feed circuit and the second liquid distribution circuit;

determining whether the measured flow rate of the supplied cooling liquid is less than a prescribed threshold minimum volume;

controlling the smart bypass control valve based on whether the flow rate of the supplied cooling liquid is less than the prescribed threshold minimum volume;

determining, whether the measured temperature of the supplied cooling liquid is less than a prescribed threshold minimum temperature; and upon determining that the measured temperature of the supplied cooling liquid is less than the prescribed threshold minimum temperature, issuing an alert message indicating that operator intervention/control is required.

2. The liquid cooling method of claim 1, further comprising:

determining whether the measured pressure within the water storage tank is less than a prescribed threshold minimum pressure; and controlling the smart bypass control valve based on whether the measured pressure within the water storage tank is less than the prescribed threshold minimum pressure.

3. The liquid cooling method of claim 1, wherein the smart bypass control valve is configured to receive and respond to the controlling instructions for opening or closing a flow of liquid therethrough.

4. The liquid cooling method of claim 1, wherein the threshold minimum volume and the threshold minimum temperature are calculated based on component performance characteristics relative to environmental conditions.

5. The liquid cooling method of claim 1, wherein, in response to determining that the measured flow rate of the supplied cooling liquid is less than the threshold minimum volume, controlling the smart bypass control valve to open and allow the auxiliary liquid feed circuit to increase the liquid flow back to the dry cooling unit.

6. The liquid cooling method of claim 2, wherein, in response to determining that the measured pressure within the water storage tank is less than the prescribed threshold minimum pressure, issuing the alert message indicating that operator intervention/control is required.

7. The liquid cooling method of claim 1, wherein, upon controlling the smart bypass control valve to open, continuing to check whether the measured flow rate of the supplied cooling liquid is still less than the threshold minimum volume.

8. The liquid cooling method of claim 1, wherein, upon determining that the measured flow rate of the supplied cooling liquid is not less than the threshold minimum volume, determining whether the measured temperature of the supplied cooling liquid is less than the prescribed threshold minimum temperature.

9. The liquid cooling method of claim 2, wherein, in response to determining that the measured pressure within the water storage tank is not less than the prescribed threshold minimum pressure while the measured flow rate of the supplied cooling liquid is less than the threshold minimum volume, controlling the smart bypass control valve to open and allow the auxiliary liquid feed circuit to increase the liquid flow back to the dry cooling unit.

10. A liquid cooling system for rack-mounted processing assemblies, comprising:

a dry cooling unit configured to supply a cooling liquid to the rack-mounted processing assemblies and receive a heated liquid from the rack-mounted processing assemblies;

a first liquid distribution circuit to convey the cooling liquid from the dry cooling unit to the rack-mounted processing assemblies;

a second liquid distribution circuit to convey the heated liquid from the rack-mounted processing assemblies to the dry cooling unit;

an auxiliary liquid feed circuit for supplementing the liquid flow back to the dry cooling unit;

each of the rack-mounted processing assemblies comprising at least one heat-generating electronic processing element and at least one liquid cooling block arranged to be in respective thermal contact with the at least one heat-generating electronic processing element and fluidly-coupled to the first liquid distribution circuit and a smart control valve respectively arranged to be fluidly-coupled to the at least one liquid cooling block of the corresponding rack-mounted processing assembly;

a first temperature sensor to measure a temperature of the supplied cooling liquid, a second temperature sensor to measure a temperature of the heated liquid from the rack-mounted processing assemblies, a pressure sensor to measure a pressure within a water storage tank, and a volume sensor to measure a flow rate of the supplied cooling liquid;

a smart bypass control valve fluidly-coupled to the auxiliary liquid feed circuit and the second liquid distribution circuit; and a freeze prevention module configured to:

determine whether the measured flow rate of the supplied cooling liquid is less than a prescribed threshold minimum volume;

control the smart bypass control valve based on whether the measured flow rate of the supplied cooling liquid is less than the prescribed threshold minimum volume;

determine, whether the measured temperature of the supplied cooling liquid is less than a prescribed threshold minimum temperature; and upon determining that the measured temperature of the supplied cooling liquid is less than the prescribed threshold minimum temperature, issue an alert message indicating that operator intervention/control is required.

11. The liquid cooling system of claim 10, wherein the freeze prevention module is configured to:

determine whether the measured pressure within the water storage tank is less than a prescribed threshold minimum pressure; and control the smart bypass control valve based on whether the measured pressure within the water storage tank is less than prescribed threshold minimum pressure.

12. The liquid cooling system of claim 10, wherein the smart bypass control valve is configured to receive and respond to control instructions from the freeze prevention module to open or close a flow of liquid therethrough.

13. The liquid cooling system of claim 10, wherein, in response to determining that the measured pressure within the water storage tank is not less than the prescribed threshold minimum pressure and that the measured flow rate of the supplied cooling liquid is less than the threshold minimum volume, controlling the smart bypass control valve to open and allow the auxiliary liquid feed circuit to increase the liquid flow back to the dry cooling unit.

14. The liquid cooling system of claim 10, wherein, upon controlling the smart bypass control valve to open, the freeze prevention module continues to check whether the measured flow rate of the supplied cooling liquid is still less than the threshold minimum volume.

15. The liquid cooling system of claim 10, wherein, the freeze prevention module is configured to, upon determining that the measured pressure within the water storage tank is less than the prescribed threshold minimum pressure, issue an alert message indicating that operator intervention/control is required.

* * * * *